United States Patent
Ma et al.

(10) Patent No.: US 7,113,114 B2
(45) Date of Patent: Sep. 26, 2006

(54) METHOD AND DEVICE OF CONVERTING DATA WORDS INTO CODE WORDS

(75) Inventors: Chang-Po Ma, Hsinchu (TW); Yung-Chi Yang, Yongkang (TW); Che-Kuo Hsu, Sanchong (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/243,099

(22) Filed: Oct. 4, 2005

(65) Prior Publication Data

US 2006/0170573 A1    Aug. 3, 2006

(30) Foreign Application Priority Data

Feb. 3, 2005    (TW)    ............... 94103394 A (51) Int. Cl.
*H03M 7/00*    (2006.01)
(52) U.S. Cl. ............. 341/59; 341/55; 341/102
(58) Field of Classification Search ........... 341/59, 341/61, 67, 69, 102, 103
See application file for complete search history.

(56) References Cited

U.S. PATENT DOCUMENTS

| | | | | |
|---|---|---|---|---|
| 5,633,632 A * | 5/1997 | Ido et al. | ........... | 341/58 |
| 5,663,726 A * | 9/1997 | Bakhmutsky | ........... | 341/67 |
| 5,696,505 A * | 12/1997 | Schouhamer Immink | .... | 341/59 |
| 6,229,458 B1 * | 5/2001 | Altekar et al. | ........... | 341/59 |
| 6,441,756 B1 * | 8/2002 | Shim | ........... | 341/59 |
| 6,476,737 B1 * | 11/2002 | Caroselli et al. | ........... | 341/59 |
| 6,505,320 B1 * | 1/2003 | Turk et al. | ........... | 714/755 |
| 6,965,329 B1 * | 11/2005 | Nakagawa et al. | ........... | 341/58 |
| 7,034,719 B1 * | 4/2006 | Shim et al. | ........... | 341/58 |
| 2002/0060634 A1 * | 5/2002 | Shim | ........... | 341/59 |
| 2005/0174264 A1 * | 8/2005 | Noda et al. | ........... | 341/59 |

* cited by examiner

*Primary Examiner*—Linh Nguyen (57) ABSTRACT

Disclosed are a method and device of converting data words into code words. This method inserts $2^p$ p guided bits before inputting each set of data words, performs a pre-defined operation, and generates $2^p$ data sequences with different guided bits. It chooses q data sequences from the $2^p$ data sequences for coding, performs a run length limited (RLL) coding with a coding rate m/n, and generates q (d, k) constrained code word sequences. Finally, an optimal (d, k) constrained code word sequence is selected from the q (d, k) constrained code word sequences. The device reduces the circuitry of the RLL coding applied guided scrambling without losing the control of direct current and low frequency components.

19 Claims, 11 Drawing Sheets

| 14 | 55 | 71 | 105 | 138 | 186 | 201 | 248 |
|---|---|---|---|---|---|---|---|
| 13 | 53 | 70 | 104 | 137 | 185 | 200 | 247 |
| 7 | 50 | 69 | 103 | 136 | 165 | 197 | 244 |
| 6 | 49 | 67 | 100 | 121 | 162 | 196 | 229 |
| 5 | 42 | 65 | 97 | 116 | 145 | 194 | 227 |
| 4 | 27 | 59 | 94 | 115 | 143 | 193 | 223 |
| 3 | 22 | 58 | 77 | 114 | 141 | 192 | 222 |
| 2 | 16 | 57 | 73 | 109 | 139 | 191 | 202 |

METHOD AND DEVICE OF CONVERTING DATA WORDS INTO CODE WORDS

FIELD OF THE INVENTION

The present invention generally relates to a method and device for data conversion, and more specifically to a method and device for converting data words into code words to reduce the circuitry complexity when applying guided scrambling mechanism.

BACKGROUND OF THE INVENTION

Guided scrambling is a member of the multi-mode code. The feature of this technology is that guided scrambling only requires a simple mechanism to encode the data word into a plurality of sets of pseudo-random code words, and uses another mechanism to select the optimal set of code word.

Figure 1:
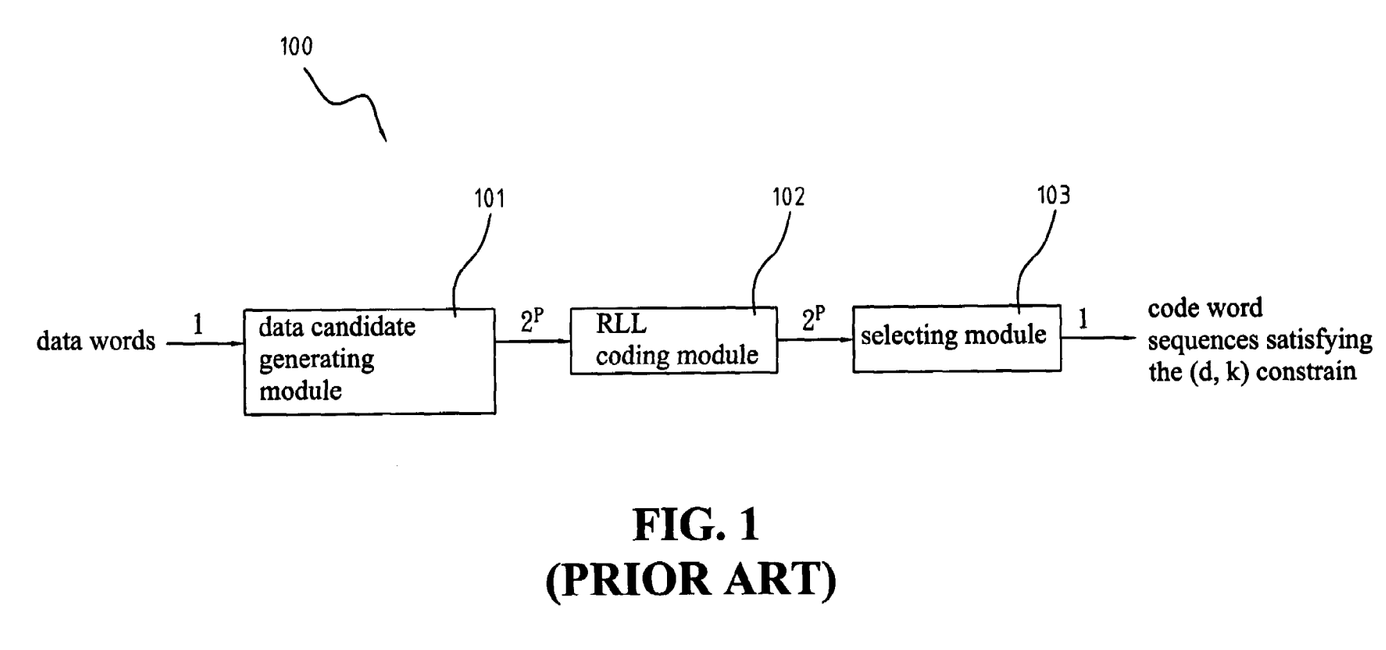
FIG. 1 shows a schematic view of the structure of a conventional guided scrambling RLL coding device.

FIG. 1 shows a schematic view of the structure of a conventional guided scrambling run length limited (RLL) coding device. As shown in FIG. 1, the number above the arrow indicates the amount of data in each region. If there are p guided bits, data candidate generating module 101 inserts p bits with value between $0-2^{p-1}$ in front of an (L-p)-bit data word and scrambles the word into $2^p$ data word sequences for encoding. RLL coding module 102 receives $2^p$ data word sequences and uses $2^p$ sets of RLL coding circuits to code them into $2^p$ code word sequences satisfying the (d, k) constrain, where d and k are the minimum and the maximum numbers of the consecutive zeros in the non-return to zero (NRZ) signals.

Selecting module 103 selects a code word sequence with the lowest direct current and low frequency components from the $2^p$ code word sequences satisfying the (d, k) constrain for output. The selection is based on the calculation of digital sum value (DSV), that is, the difference of the number of bits between the high level and low level of all RLL code words prior to the calculation time; then, the minimum absolute value of the final DSV is outputted; alternatively, the DSV at different time is squared and accumulated, and the one with the minimum value is outputted. However, conventional guided scrambling RLL coding device requires a large number (i.e., $2^p$ sets) of RLL coding circuitry, even though it improves the direct current and low frequency components of the RLL coding and avoids the appearance of synchronization pattern.

Guided scrambling shows good effects in direct current controlling for the RLL code words conversion, but the RLL coding circuitry is too complex. Therefore, the present invention focuses on a converting method and device satisfying two conditions: (1) the adding of the scrambled data words to the output RLL code words will not lose the control effect of the direct current and low frequency component, and (2) the RLL coding circuitry complexity is effectively reduced.

SUMMARY OF THE INVENTION

The present invention has been made to overcome the aforementioned drawback of conventional guided scrambling RLL coding device that uses a highly complex RLL coding circuitry. The primary object of the present invention is to provide a method for converting data words to code words in guided scrambling mechanism with reducing RLL coding circuitry complexity.

Accordingly, the method of the present invention includes the following steps. First, it inserts p guided bits before inputting each set of data words, perform a pre-defined operation, and generate $2^p$ data sequences with different guided bits. Next, it compares with a default match set and chooses q data sequences from the $2^p$ data sequences for coding, and then performs a run length limited (RLL) coding with an coding rate m/n, and generates q (d, k) constrained code word sequences. Finally, an optimal (d, k) constrained code word sequence is selected from the q (d, k) constrained code word sequences, where p and q are positive integers with $q<2^p$, m is the length of the data bits, n is the length of the code word bits, d is the minimum numbers of the consecutive zeros in the code word, and k is the maximum numbers of the consecutive zeros in the code word.

The present invention explores the fact that when the amount of the inserted redundancy reaches a certain amount, the distribution of the selected data sequences will depend on the RLL coding method. By utilizing the non-uniform distribution of the data after encoding, the present invention develops a method and device for converting data words into code words in guided scrambling mechanism with reducing RLL coding circuitry complexity.

Another object of the present invention is to provide a device for converting data words to code words in guided scrambling mechanism with reducing RLL coding circuitry complexity. Accordingly, the device of the present invention includes a data candidate generating module, a pre-selecting module, an RLL coding module and a selecting module. The data candidate generating module inserts p guided bits before each set of input data words, performs a pre-defined operation, and generates $2^p$ data sequences with different guided bits. The pre-selecting module chooses q data sequences from the $2^p$ data sequences for coding, performs an RLL coding with an coding rate m/n, and generates q (d, k) constrained code word sequences. Finally, the selecting module selects an optimal (d, k) constrained code word sequence from the q (d, k) constrained code word sequences.

The experimental results show that when coding rate is 8/15 and the redundancy is 4 bits/64 bits, the present invention selects 4 data sequences from the 16 candidate data sequences and performs RLL coding. The actual RLL coding circuitry is about ¼ of that of the conventional guided scrambling RLL coding device to achieve the same control effect of direct current and low frequency component. That is, the power frequency spectrum density is −32 dB at the normal frequency $10^{-4}$. In summary, the device of the present invention reduces the circuitry of the RLL coding applied guided scrambling without losing the control of direct current and low frequency components.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 2:
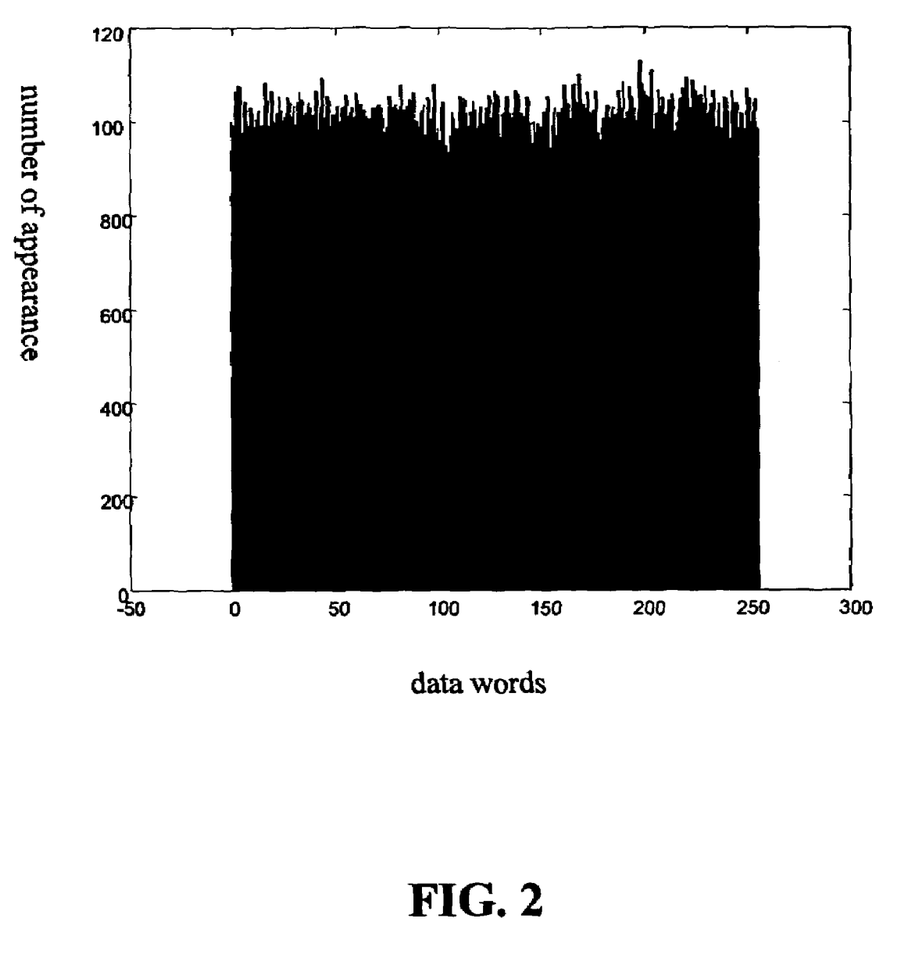
FIG. 2 shows the input data distribution of a conventional guided scrambling RLL coding device.
Figure 3A:
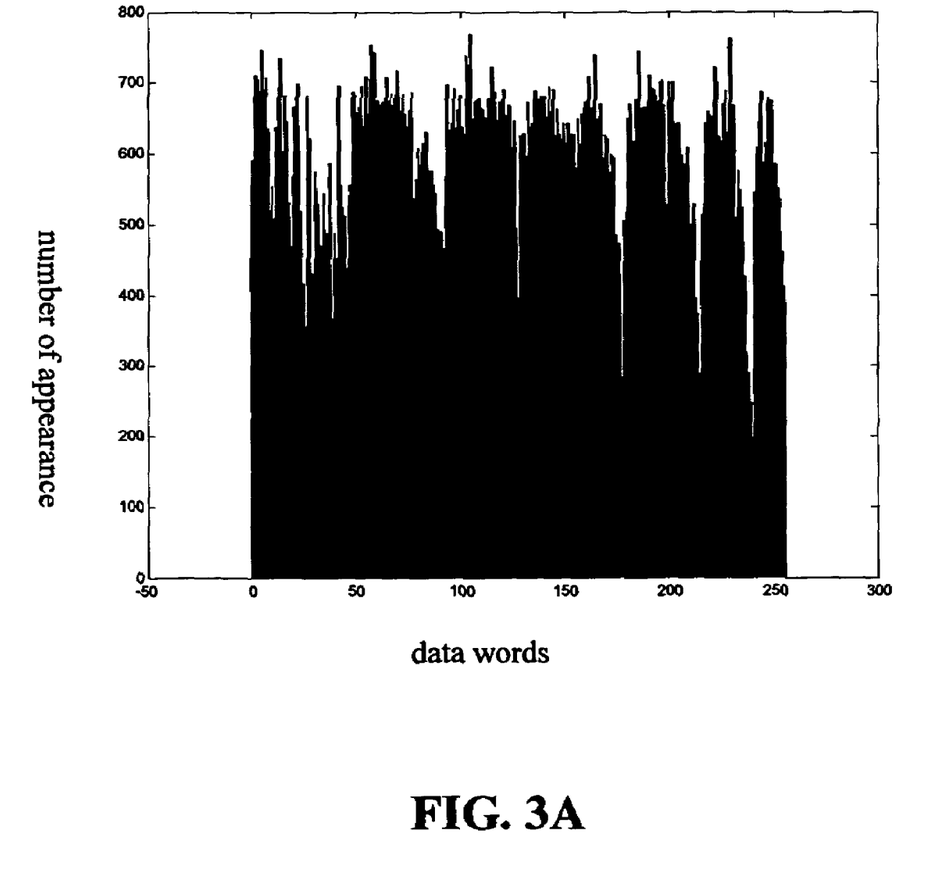
FIG. 3A shows the output data distribution of a conventional guided scrambling RLL coding device when redundancy is 8 bits/36 bits.
Figure 3B:
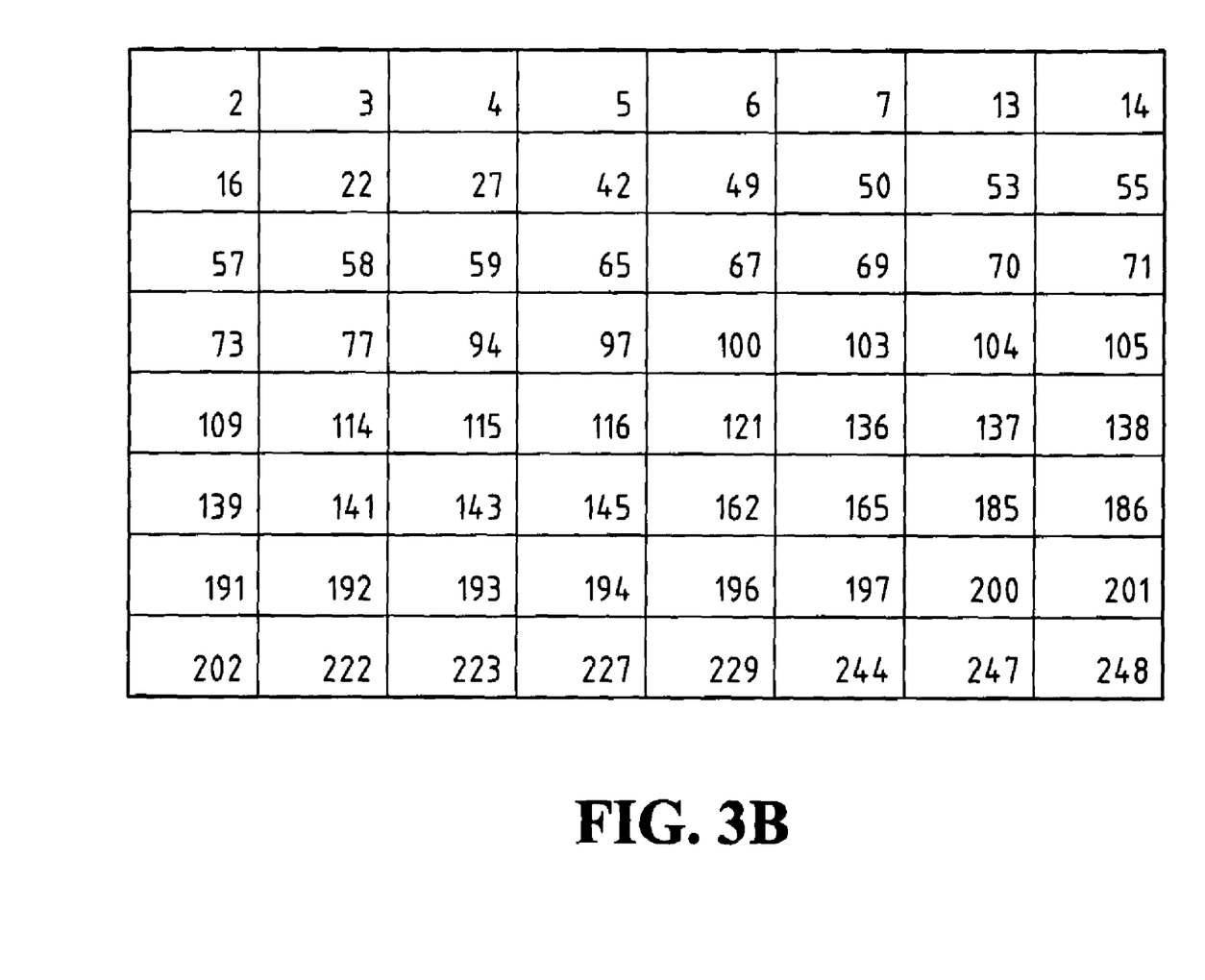
FIG. 3B shows the most appearances of the first 64 data in FIG. 3A.

FIG. 2 shows the input data distribution of a conventional guided scrambling RLL coding method. FIG. 3A shows the output data distribution of a conventional guided scrambling RLL coding method when redundancy is 8 bits/36 bits, and FIG. 3B shows the most appearances of the first 64 data in FIG. 3A.

As shown in FIG. 2, the input data distribution of a conventional guided scrambling RLL coding method is relatively uniform. However, when the inserted redundancy reaches a certain amount, the output data distribution after guided scrambling by selecting module 103 and RLL coding will be different in accordance with the RLL coding method used. As shown in FIG. 3A, the output data distribution of a conventional guided scrambling RLL coding method when redundancy is 8 bits/36 bits is non-uniform in comparison with that of FIG. 2. The 64 data with most appearance are shown in FIG. 3B. The present invention exploits the non-uniformity of the output data distribution and develops a method and a device for converting data words to code words.

Figure 4:
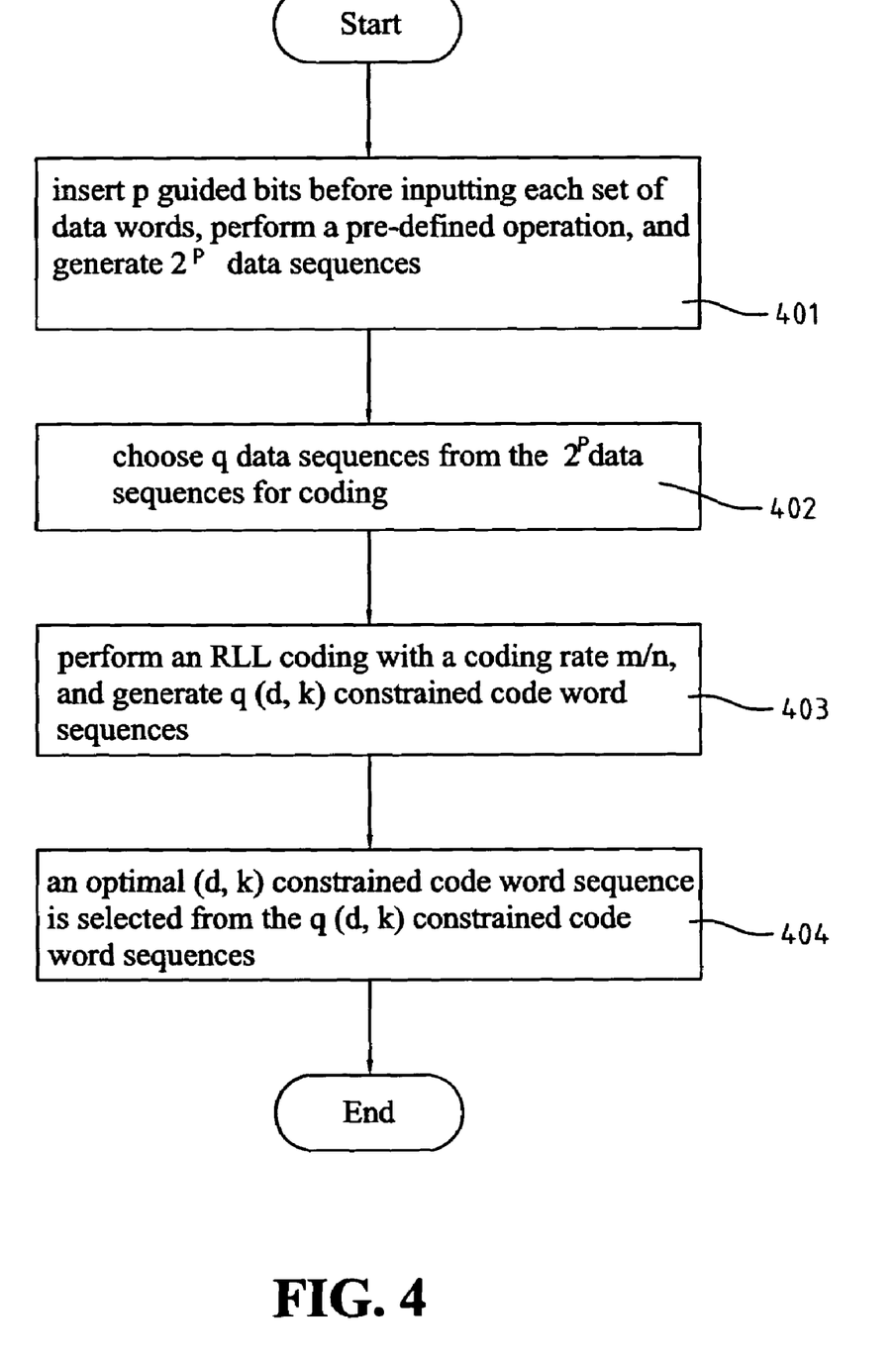
FIG. 4 shows the conversion method from data words into code words according to the present invention.

FIG. 4 shows a conversion method of the present invention. As shown in FIG. 4, the method of the present invention includes the following four steps. Step 401 is to insert $2^p$ p guided bits before inputting each set of data words, perform a pre-defined operation, and generate $2^p$ data sequences. Step 402 is to choose q data sequences from the $2^p$ data sequences for coding. Step 403 is to perform an RLL coding with a coding rate m/n, and generate q (d, k) constrained code word sequences. Finally, in step 404, an optimal (d, k) constrained code word sequence is selected from the q (d, k) constrained code word sequences, where p and q are positive integers with $q<2^p$, m is the length of the data bits, n is the length of the code word bits, d is the minimum numbers of the consecutive zeros in the code word, and k is the maximum numbers of the consecutive zeros in the code word.

According to the present invention, the present invention utilizes the non-uniformity of data distribution to select, in step 402, q data sequences from the $2^p$ data sequences for coding according to a default match set and a default matching method, where the default match set includes x elements. The x elements are the most appearances of data words in the optimal (d, k) constrained code word sequence selected by selecting module 103 with redundancy p' guided bits/L data words. Each element includes m bits of data, and x, p', L are positive integers. As the example shown in FIG. 3B, when p'=8, m=8, L=36, x=64, the default match set includes 64 elements.

Figure 5A:
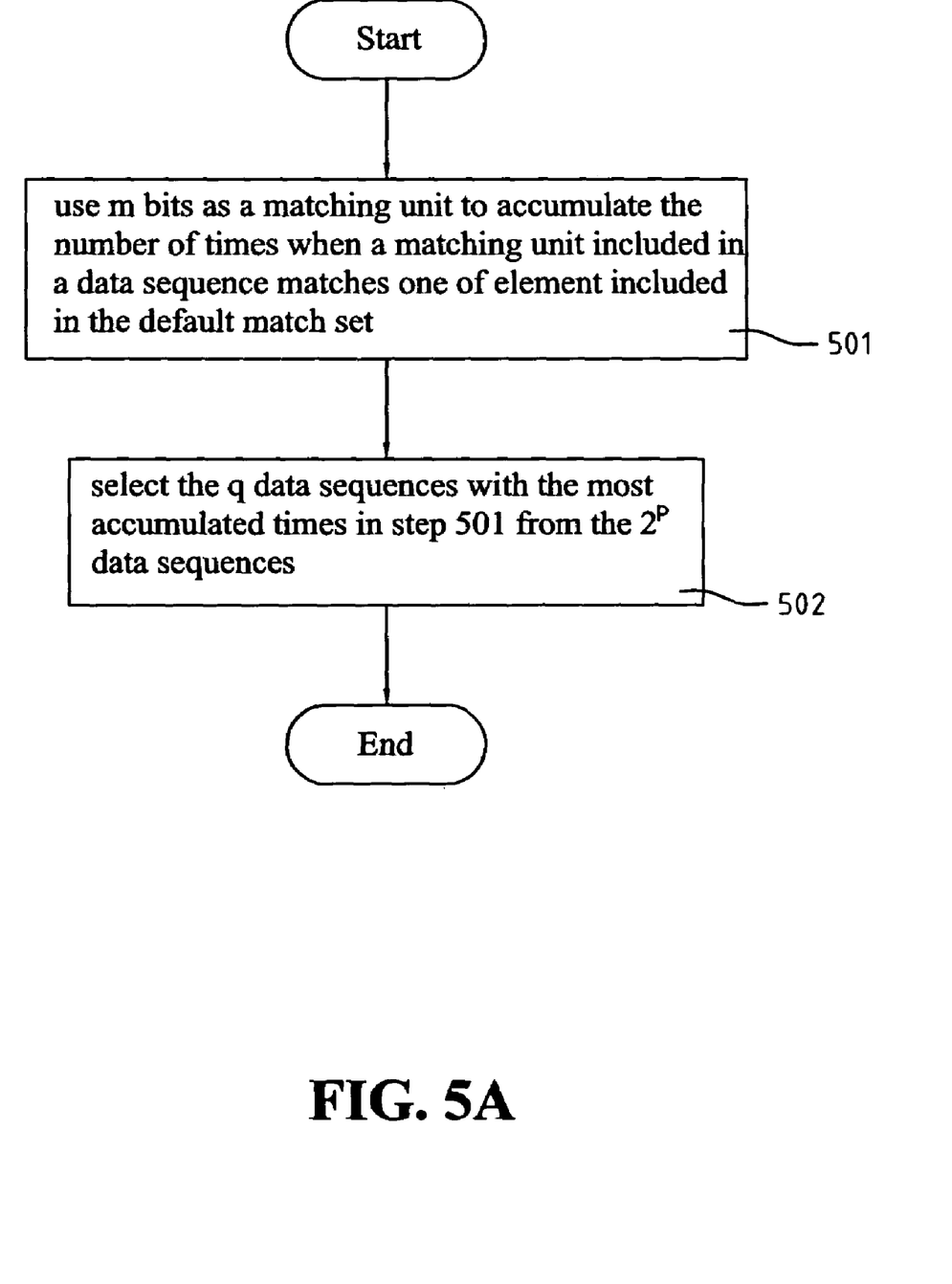
FIG. 5A shows a flowchart of a default matching step.

FIG. 5A is a flowchart of the steps of a default match method. As shown in FIG. 5A, the method includes the following steps. Step 501 is to use m bits as a matching unit to accumulate the number of times when a matching unit included in a data sequence matches one of element included in the default match set. Step 502 is to select the q data sequences with the most accumulated times in step 501 from the $2^p$ data sequences.

As the elements in the default match set have the most appearances in the conventional conversion output, and the difference in the numbers of appearances may be potentially large, it may be appropriate to assign a weight to each element to balance the difference between the numbers of appearances. Therefore, in step 402, in addition to a default match method and a default match set, a default weight set corresponding to the default match set is included. Each element in the default match set has a corresponding weight in the default weight set when selecting q data sequences from the $2^p$ data sequences.

Figure 5B:
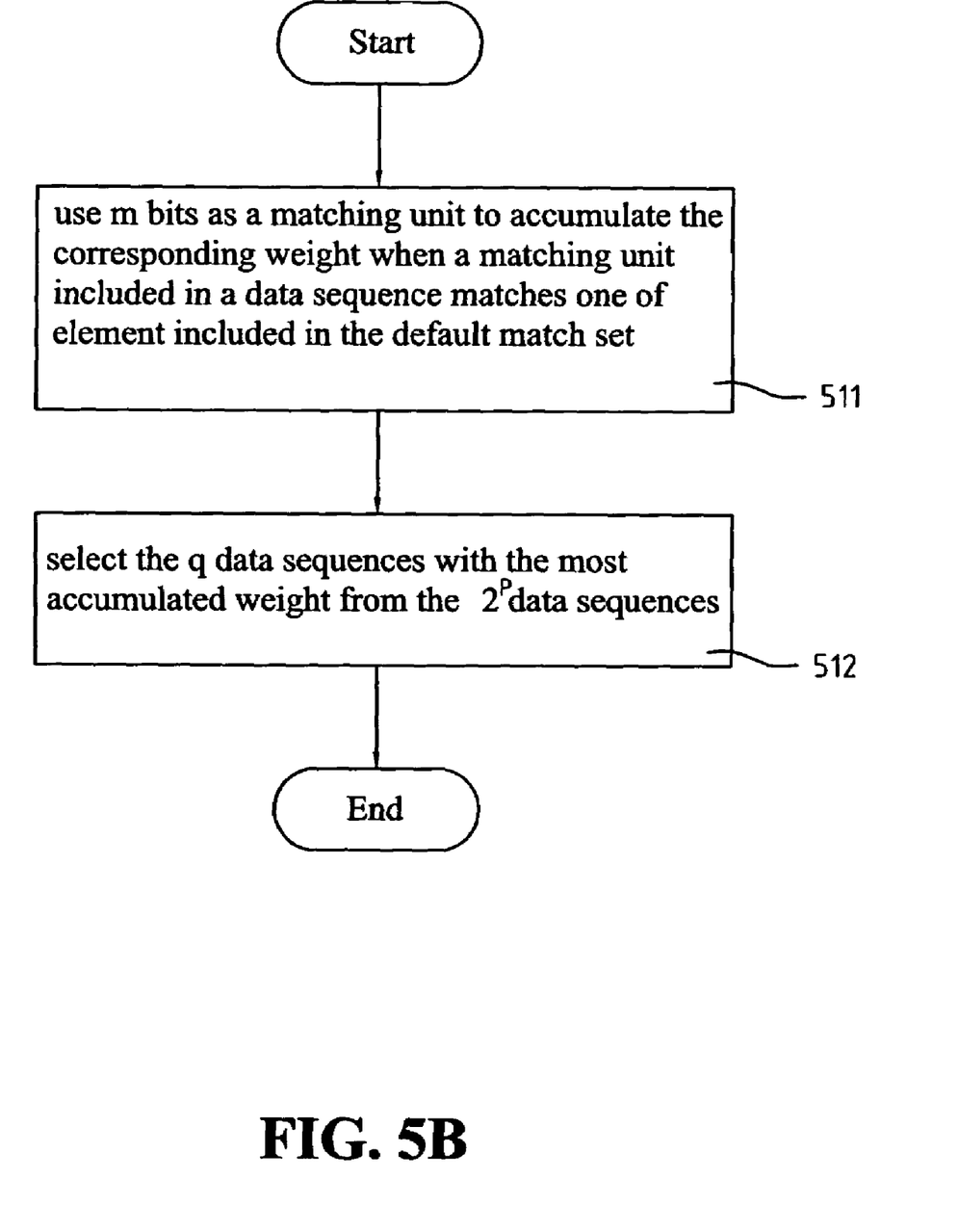
FIG. 5B shows a flowchart of another default matching step.

FIG. 5B shows a flowchart of another default match method. As shown in FIG. 5B, this default match method takes the corresponding weight of each element into account. The method includes the following steps. Step 511 is to use m bits as a matching unit to accumulate the corresponding weight when a matching unit included in a data sequence matches one of element included in the default match set. Step 512 is to select the q data sequences with the most accumulated weight from the $2^p$ data sequences.

Figure 6:
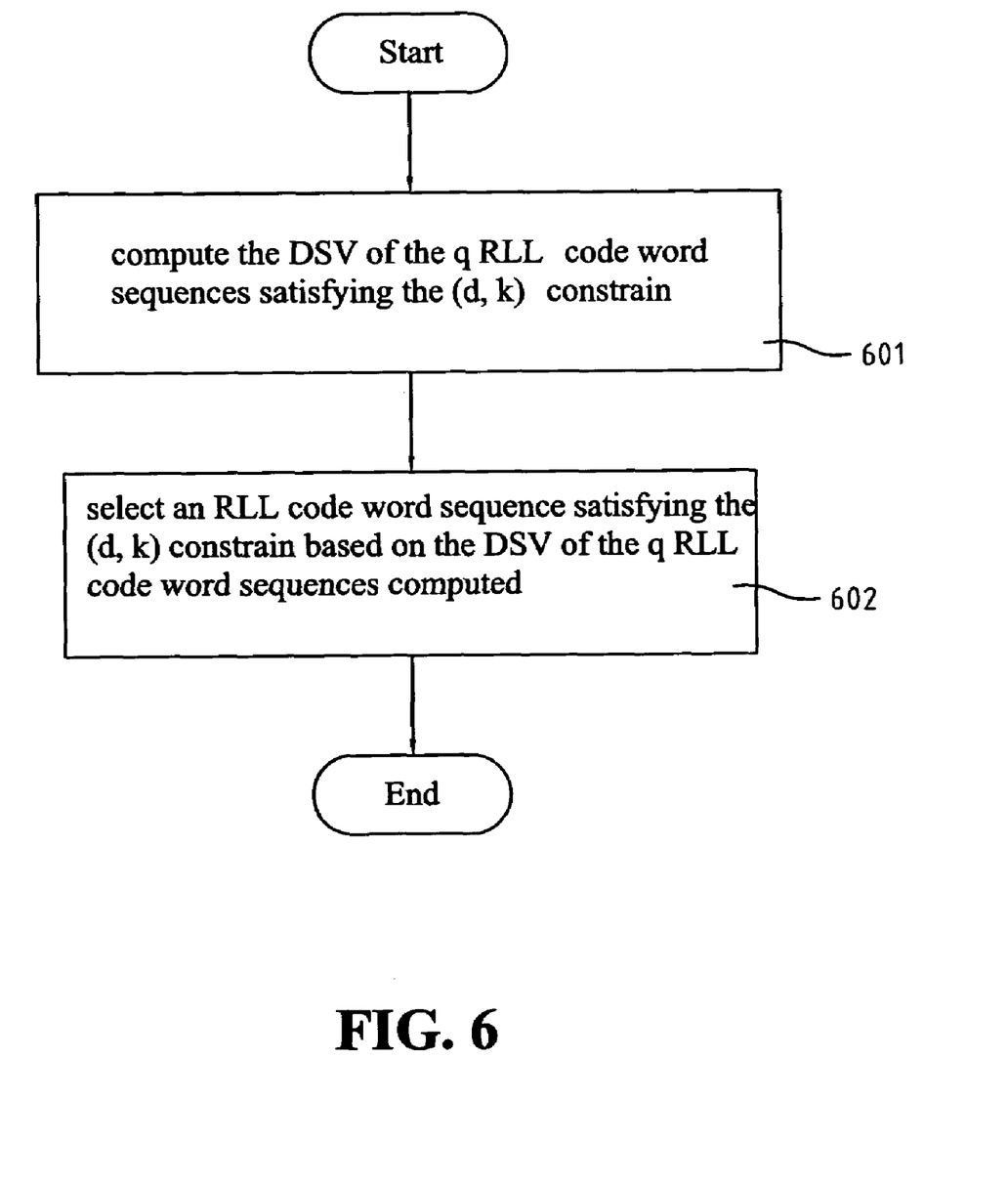
FIG. 6 shows a flowchart of the selection in step 404.

FIG. 6 is a flowchart of the selecting steps in step 404. As shown in FIG. 6, step 404 of FIG. 4 includes the following steps. Step 601 is to compute the DSV of the q RLL code word sequences satisfying the (d, k) constrain. Step 602 is to select an RLL code word sequence satisfying the (d, k) constrain based on the DSV of the q RLL code word sequences computed in step 601.

Step 404 in FIG. 4 is to select an RLL code word sequence satisfying the (d, k) constrain with the lowest direct current and low frequency component from the q RLL code word sequences satisfying the (d, k) constrain. The DSV should be computed during the selection. That is, the difference of the number of bits between the high level and low level of all RLL code words prior to the calculation time; then, the minimum absolute value of the final DSV is outputted; alternatively, the DSV at different time is squared and accumulated, and the one with the minimum value is outputted.

Figure 7A:
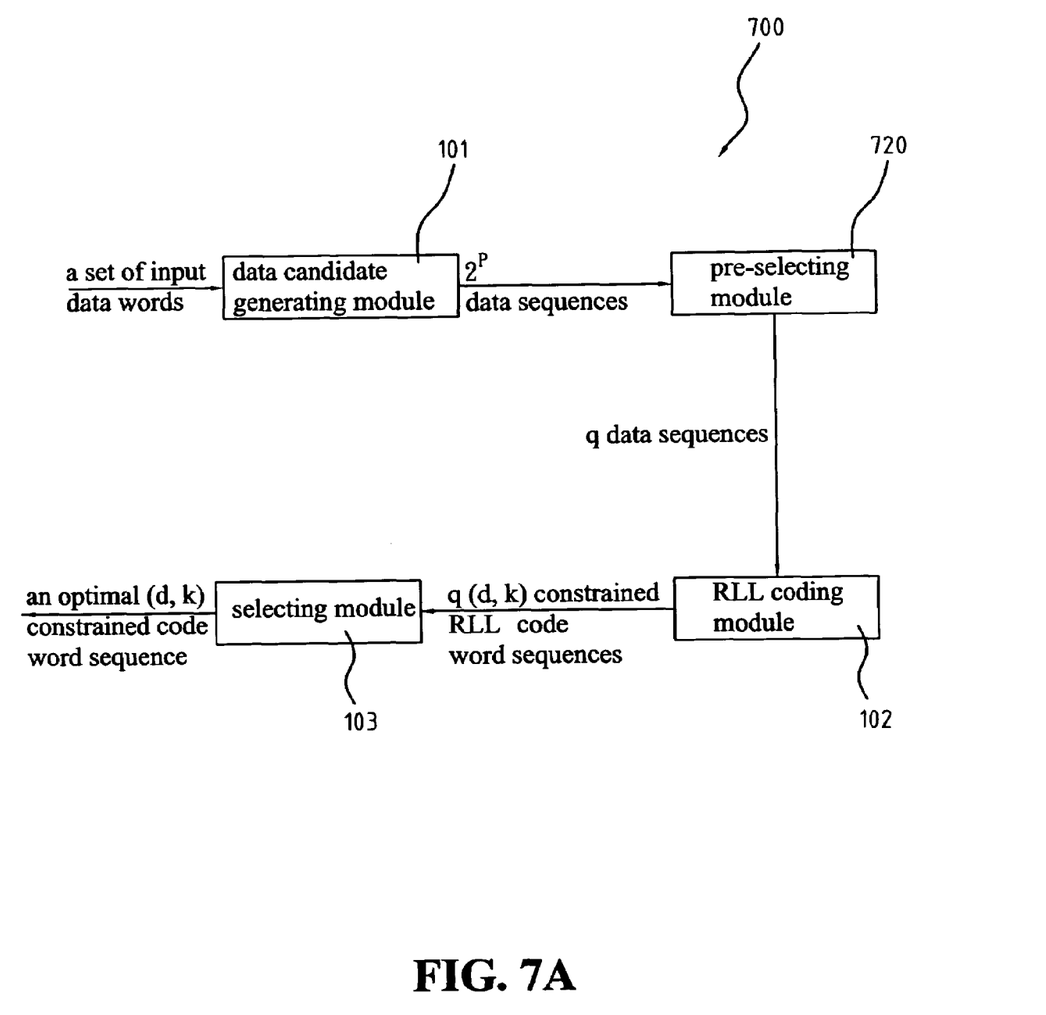
FIG. 7A shows a schematic view of the conversion device according to the present invention.
Figure 7B:
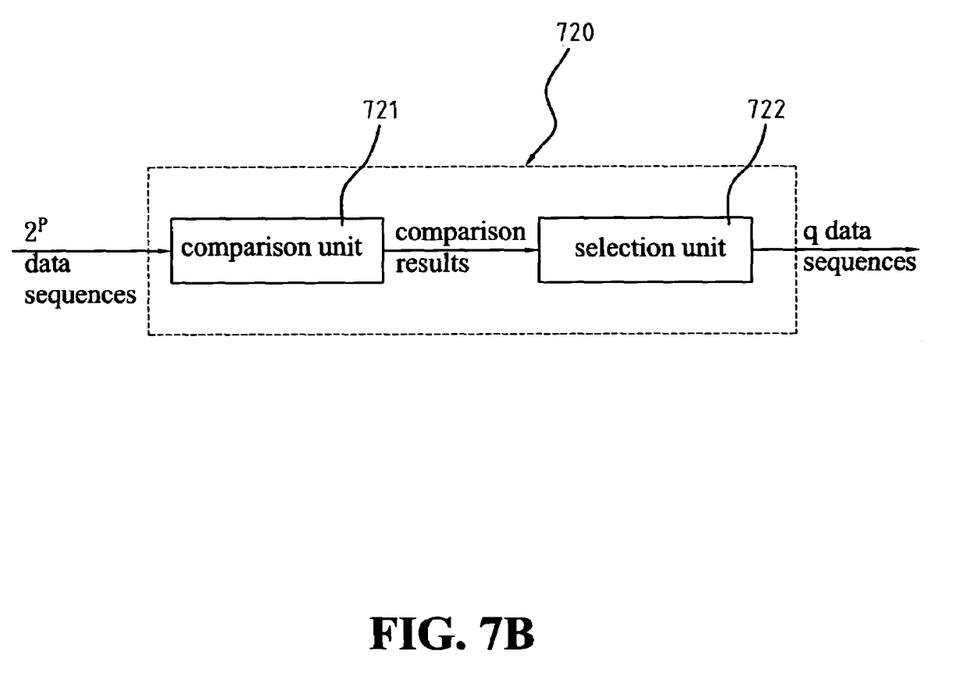
FIG. 7B shows a schematic view of a pre-selecting module.

FIG. 7A is a schematic view of the conversion device of the present invention, and FIG. 7B is a schematic view of the pre-selecting module.

As shown in FIG. 7A, a conversion device 700 of the present invention includes a data candidate generating module 101, a pre-selecting module 720, an RLL coding module 102 and a selecting module 103. Data candidate generating module 101 inserts $2^p$ p guided bits before each set of input data words, performs a pre-defined operation, and generates $2^p$ data sequences. Pre-selecting module 720 chooses q data sequences from the $2^p$ data sequences for coding. RLL coding module 102 performs an RLL coding with a coding rate m/n, and generates q (d, k) constrained RLL code word sequences. Finally, selecting module 103 selects an optimal (d, k) constrained code word sequence from the q (d, k) constrained code word sequences.

According to the present invention, the default computation by data candidate generating module 101 is a scrambling operation to improve the low frequency component control of the RLL code words by scrambling the code words after inserting p guided bits. Pre-selecting module 702 selects q data sequences from the $2^p$ data sequences according to the aforementioned default match set.

Pre-selecting module 720 includes a comparison unit 721 and a selection unit 722. Comparison unit 721 receives the $2^p$ data sequences, performs the default matching operation of $2^p$ data sequences against the default match set, and outputs the results. Selection unit 722 receives the results from comparison unit 721 and selects the q data sequences with the best results of comparison. Comparison unit 721 uses m bits as a matching unit to accumulate the number of times when a matching unit included in a data sequence matches one of element included in the default match set. Selection unit 722 selects the q data sequences with the most accumulated times by comparison unit 721 from the $2^p$ data sequences.

In addition to a default match method and a default match set, a default weight set corresponding to the default match set may be included in pre-selecting module 720. Each element in the default match set has a corresponding weight in the default weight set when selecting q data sequences from the $2^p$ data sequences. In this aspect, comparison unit 721 uses m bits as a matching unit to accumulate the corresponding weight when a matching unit included in a data sequence matches one of element included in the default match set. Selection unit 722 is to select the q data sequences with the most accumulated weight by comparison unit 721 from the $2^p$ data sequences.

The following description uses an example of coding rate=8/15, guided bits p=4, and redundancy=4 bits/64 bits to explain the operation of the device of the present invention.

The RLL code words generated by the conversion device of the present invention satisfy the (2,12) constrain. The length of the look ahead is 9. Data candidate generating module 101 changes the data words from byte format to binary format, and selects a data word B of fixed length L=64×8−4=508 bits. Four bits from 0000–1111 are inserted in front of the data word B to form 16 sets of signals Ci.

C0=0000B,
C1=0001B,
C2=0010B,
. . .
C15=1111B.

Then, all the signals Ci are scrambled. The scrambling polynomial used in data candidate generating module 101 is $x^7+x^3+1$. After scrambling, 16 data sequences Di are generated. Pre-selecting module 720, based on the non-uniform distribution of FIG. 3B, determines a default match set. The value of the elements ranges from 0 to 255, and the number of the elements is less than 256. Based on the 16 data sequences Di, the number of appearance of each element in the default match set is accumulated, and the q=4 data sequences with the most appearances are selected. Thus, q=4, p=4, and q<$2^p$. Then, the 4 data sequences are coded to generate 4 RLL code word sequences satisfying the (d, k) constrain, and an RLL code word sequence is selected from the four coded word sequences with the optimal control of direct current and low frequency component and satisfying the (d, k) constrain.

Figure 8:
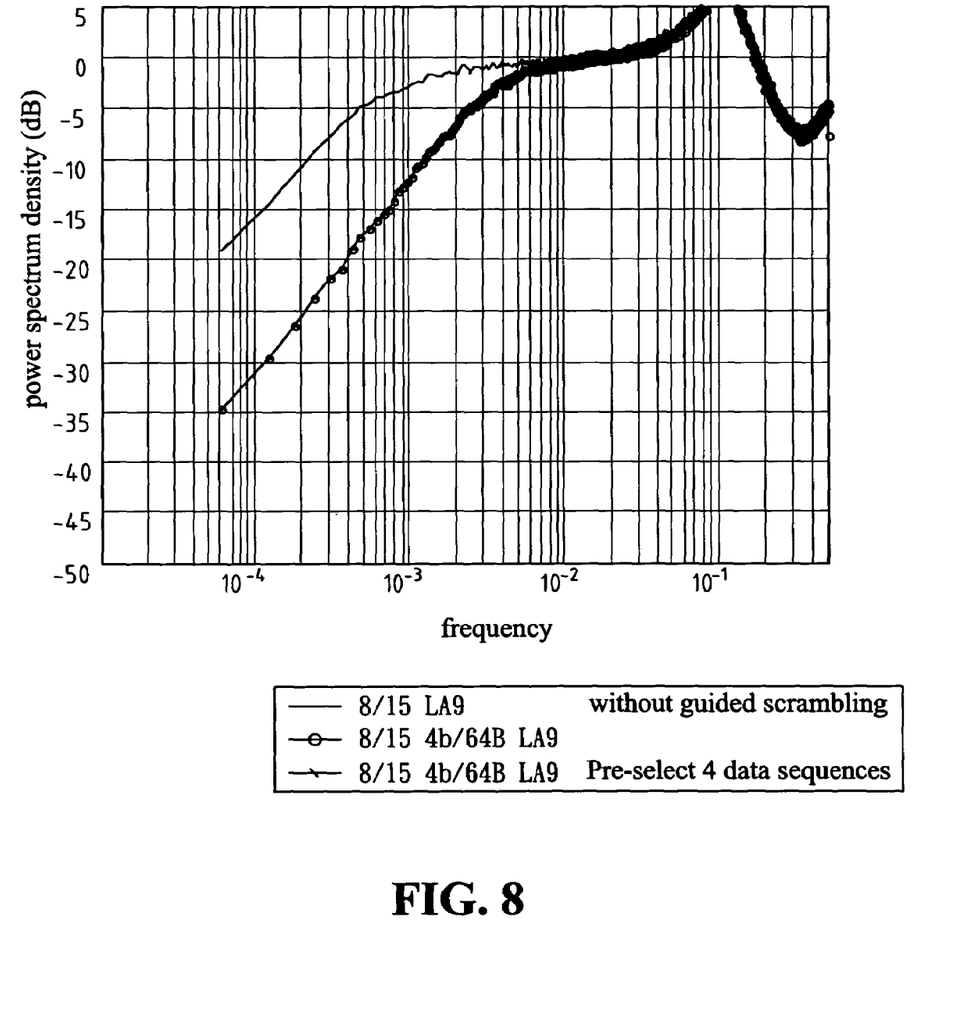
FIG. 8 shows a comparison of the power spectrum density of conventional RLL coding device, conventional guided scrambling RLL coding device, and the present invention, based on 8/15 RLL coding.

FIG. 8 shows the comparison of power spectrum density (PSD) of conventional RLL coding device, conventional guided scrambling RLL coding device and the present invention, based on 8/15 RLL coding.

As shown in FIG. 8, the experiment results show that the conventional guided scrambling RLL has the PSD of −32 dB at normal frequency $10^{-4}$ when redundancy is 4 bits/64 bits; that is, 4 guided bits are inserted in a 64-bit data. The PSD of the conventional guided scrambling RLL coding device is much better than that of the conventional RLL coding device, but the circuit complexity increases $2^4$=16 times.

The device of the present invention includes a pre-selecting module to select 4 data sequences from the 16 data sequences before RLL coding. Therefore, the circuit complexity is 4 times of that of the conventional RLL coding device, and is only ¼ of that of the conventional guided scrambling RLL coding device in order to achieve the same PSD, i.e., −32 dB at normal frequency $10^{-4}$. It indicates that the present invention outputs the RLL coded words can greatly reduce the circuit complexity without losing the control of direct current and low frequency component.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for converting data words to code words, comprising the steps of:
   (a) inserting p guided bits before inputting each set of data words, performing a default operation, and generating $2^p$ data sequences with different guided bits;
   (b) selecting q data sequences from said $2^p$ data sequences for coding;
   (c) performing a run length limited (RLL) coding with a coding rate m/n, and generating q code word sequences satisfying (d, k) constrain; and
   (d) selecting an optimal (d, k) constrained code word sequences from said q (d, k) constrained code word sequences;
   wherein p and q are positive integers with q<$2^p$, m is the length of the data bits, n is the length of the code word bits, d is the minimum numbers of the consecutive zeros in the code word, and k is the maximum numbers of the consecutive zeros in the code word.

2. The method as claimed in claim 1, wherein said default operation is a scrambling operation.

3. The method as claimed in claim 1, wherein said step (b) selects q data sequences from $2^p$ data sequences based on a default match set and a default match method.

4. The method as claimed in claim 3, wherein said default match set comprise x elements, with each element having m bits, and x is a positive integer.

5. The method as claimed in claim 4, wherein said x elements are the most appearances of data words in the optimal (d, k) constrained code word sequence with redundancy p' guided bits/L data words, and x, p', L are positive integers.

6. The method as claimed in claim 4, wherein said default match method comprises the following steps of:
   (1) using m bits as a matching unit to accumulate the number of times when a matching unit included in a data sequence matches one of element included in said default match set; and
   (2) selecting q data sequences with the most accumulated times in step (1) from said $2^p$ data sequences.

7. The method as claimed in claim 4, wherein said step (b) further comprises a default weight set corresponding to said default match set, and each said element in said default match set has a corresponding weight in said default weight set, and said default match method further comprises the following steps of:
   (1) using m bits as a matching unit to accumulate said corresponding weight when a matching unit included in a data sequences matches one of element included in said default match set; and (2) selecting q data sequences with the most accumulated weight in step (1) from said $2^p$ data sequences.

8. The method as claimed in claim 1, wherein said step (d) further comprises the following steps of:

(d1) computing digital sum value (DSV) of said q code word sequences satisfying (d, k) constrain; and (d2) selecting an code word sequence satisfying (d, k) constrain from said q code word sequences satisfying (d, k) constrain, based on said computed DSV.

9. A device for converting data words to code words, comprising:

a data candidate generating module, for inserting p guided bits before each set of input data words, performing a default operation, and generating $2^p$ data sequences with different guided bits;

a pre-selecting module, for selecting q data sequences from said $2^p$ data sequences for coding;

an RLL coding module, for performing a run length limited (RLL) coding with an coding rate m/n, and generating q code word sequences satisfying (d, k) constrain; and a selecting module, for selecting an optimal code word sequence satisfying (d, k) constrain from said q code word sequences satisfying (d, k) constrain;

wherein p and q are positive integers with q<$2^p$, m is the length of the data bits, n is the length of the code word bits, d is the minimum numbers of the consecutive zeros in the code word, and k is the maximum numbers of the consecutive zeros in the code word.

10. The device as claimed in claim 9, wherein said default operation is a scrambling operation.

11. The device as claimed in claim 9, wherein said pre-selecting module selects q data sequences from said $2^p$ data sequences based on a default match, said pre-selecting module further comprises:

a comparison unit, for receiving said $2^p$ data sequences, performing a default matching operation of $2^p$ data sequences against said default match set, and outputting the results of comparison; and a selection unit, for receiving said results from said comparison unit and selecting the q data sequences with the best results of comparison.

12. The device as claimed in claim 11, wherein said default match set comprise x elements, with each element having m bits, and x is a positive integer.

13. The device as claimed in claim 11, wherein said x elements are the most appearances of data words in the optimal (d, k) constrained code word sequences redundancy p' guided bits/L data words, and x, p', L are positive integers.

14. The device as claimed in claim 12, wherein said comparison unit uses m bits as a matching unit to accumulate the number of times when a matching unit included in a data sequence matches one of element included in said default match set.

15. The device as claimed in claim 14, wherein said results are the accumulated times.

16. The device as claimed in claim 12, wherein said pre-selecting module further comprises a default weight set corresponding to said default match set, and each said element in said default match set has a corresponding weight in said default weight set.

17. The device as claimed in claim 16, wherein said comparison unit uses m bits as a matching unit to accumulate said corresponding weight when a matching unit included in a data sequence matches one of element included in said default match set.

18. The device as claimed in claim 17, wherein said results are the accumulated weights.

19. The device as claimed in claim 9, wherein said selecting module receives said q code word sequence satisfying (d, k) constrain, computes digital sum value (DSV) of said q code word sequences satisfying (d, k) constrain, and selects an code word sequence satisfying (d, k) constrain from said q code word sequences satisfying (d, k) constrain, based on said computed DSV.

* * * * *